(12) United States Patent
Myers et al.

(10) Patent No.: US 7,118,940 B1
(45) Date of Patent: Oct. 10, 2006

(54) METHOD OF FABRICATING AN ELECTRONIC PACKAGE HAVING UNDERFILL STANDOFF

(75) Inventors: Bruce A. Myers, Kokomo, IN (US); David W. Ihms, Russiaville, IN (US); Todd P. Oman, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/198,444

(22) Filed: Aug. 5, 2005

(51) Int. Cl.
*H01L 21/48* (2006.01)
*H01L 23/48* (2006.01)
*B23K 31/02* (2006.01)

(52) U.S. Cl. ............... 438/108; 228/180.22; 257/738; 257/779

(58) Field of Classification Search .................. None
See application file for complete search history.

(56) References Cited

U.S. PATENT DOCUMENTS

| | | | |
|---|---|---|---|
| 4,641,222 A | 2/1987 | Derfiny et al. | |
| 4,731,130 A | 3/1988 | O'Leary | |
| 5,315,070 A | 5/1994 | Maiwald | |
| 5,328,521 A | 7/1994 | Keusseyan | |
| 5,926,731 A | 7/1999 | Coapman et al. | |
| 5,931,371 A | 8/1999 | Pao et al. | |
| 6,340,113 B1 | 1/2002 | Avery et al. | |
| 6,373,142 B1* | 4/2002 | Hoang | 257/783 |
| 6,631,078 B1 | 10/2003 | Alcoe et al. | |
| 6,649,444 B1* | 11/2003 | Earnworth et al. | 438/108 |
| 6,650,560 B1* | 11/2003 | MacDonald et al. | 363/142 |
| 6,677,677 B1* | 1/2004 | Kimura et al. | 257/737 |
| 6,784,555 B1* | 8/2004 | Watson | 257/783 |
| 6,919,642 B1* | 7/2005 | Hsieh et al. | 257/778 |
| 6,986,454 B1* | 1/2006 | Stillabower | 228/180.22 |
| 2002/0146861 A1* | 10/2002 | Standing | 438/108 |
| 2005/0006442 A1 | 1/2005 | Stillabower | |
| 2005/0208704 A1* | 9/2005 | Akram et al. | 438/108 |

FOREIGN PATENT DOCUMENTS

| | | |
|---|---|---|
| JP | 06-054503 | 2/1994 |
| JP | 07-045926 | 2/1995 |
| JP | 07-131586 | 5/1995 |
| JP | 11-026910 | 1/1999 |
| JP | 2000299330 A * | 10/2000 |

OTHER PUBLICATIONS

"Kester Receives Vision Award for SE-CURE 9111 Single Pass Reflow Encapsulant," Press Release, dated Mar. 3, 2004, 1 page.
"Kester—Anti-Collapse Reflow Encapsulant Technology for FCOF," IMAPS Flip-Chip 2003, Austin, Texas, 21 pages.

* cited by examiner

*Primary Examiner*—Alonzo Chambliss
(74) *Attorney, Agent, or Firm*—Jimmy L. Funke

(57) ABSTRACT

An electronic package having a controlled standoff height between a surface mount device and a circuit board. The electronic package includes a circuit board having a substrate and circuitry including mounting pads and a surface mount device having circuitry and contact terminals. Solder joints connect the contact terminals of the surface mount device to the mounting pads on the circuit board. A dielectric underfill is disposed between the circuit board and the surface mount device, and a plurality of standoff members are disposed in the underfill material to provide a separation distance between the circuit board and the surface mount device.

17 Claims, 2 Drawing Sheets

METHOD OF FABRICATING AN ELECTRONIC PACKAGE HAVING UNDERFILL STANDOFF

TECHNICAL FIELD

The present invention generally relates to circuit board packages, and more particularly relates to a controlled height interconnection of a surface mount electronic device onto a circuit board.

BACKGROUND OF THE INVENTION

Electronic packages typically incorporate a plurality of surface mount electronic devices, such as flip chips, ball grid arrays, and circuit components such as diodes, inductors, capacitors, resistors, varistors, etc., assembled onto a printed circuit board. The printed circuit board typically includes a dielectric substrate (e.g., organic resin reinforced by fibers) and multiple layers of electrically conductive circuit traces. Many electronic packages employ lead-less surface mount devices that are connected to the printed circuit board via solder joints (e.g., solder bumps).

Many conventional soldered surface mount devices have been known to suffer from thermal fatigue in the solder joint, particularly when large surface mount devices are mounted on an organic circuit board and utilized in an environment experiencing high temperature and/or wide temperature variations. Solder joint fatigue may be caused by large differences in the differential coefficients of thermal expansion (CTE) that often exists between the circuit board and the surface mount device materials. The differences in thermal expansion can result in catastrophic cracking of brittle components such as surface mount capacitors. Generally, larger components experience higher stress and, thus, shorter component life. However, large components are often desirable because fewer components are typically required.

Surface mount devices typically have much smaller coefficients of thermal expansion as compared to organic-based substrates employed in the circuit board. Temperature fluctuations of the electronic package with continuous power cycles generally produce accumulative fatigue in the solder joints. This accumulative thermal fatigue reduces intergranular precipitation and alloy separation in the solder joints that accelerates component breakage. The solder joint fatigue may be further accelerated by the presence of vibrations. Additionally, some surface mount devices are pulled down tightly to the mounting pads by the action of gravity, soldering and capillary attraction, thereby resulting in very low columnar compliance. This may further result in catastrophic electrical failure of the package due to breakage of the solder joint and/or surface mount device.

Several approaches have been proposed to elevate the surface mount device(s) from the circuit board. According to one approach, high temperature standoff members are disposed in the solder paste, such that during reflow the high temperature solder standoff members remain solid (rigid), and thus provide a standoff height to elevate the surface mount device from the circuit board. One example of an approach that employs standoff members in the solder joint is disclosed in U.S. Pat. No. 6,986,454, the entire disclosure of which is hereby incorporated herein by reference.

While the aforementioned approach overcomes some problems and/or drawbacks of prior known solder joint connections, some drawbacks may still exist. Prior known connections may restrict underfill and overmold flow materials that may be required to make some components more reliable during thermal cycling. Additionally, the ability of prior conventional approaches to maintain solder joint thickness may be limited by solder stop and solder mask pattern registration.

Accordingly, it is therefore desirable to provide for an electronic package having a surface mount device to circuit board interconnection that does not unduly suffer adverse thermal fatigue. In particular, it is desirable to provide for an electronic package that eases restrictions to underfill and overmold flow materials and does not unduly limit the ability to maintain solder joint thickness by solder stop and solder mask pattern registration.

SUMMARY OF THE INVENTION

In accordance with the teachings of the present invention, an electronic package is provided that achieves a controlled standoff height between a surface mount device and a circuit board. The electronic package includes a circuit board having a substrate and circuitry having at least one mounting pad. The package also includes a surface mount device having circuitry and at least one contact terminal. The package has at least one solder joint connecting at least one contact terminal of the surface mount device to at least one mounting pad on the circuit board. The solder joint has a reflowable solder. The package further includes an underfill material disposed between the circuit board and the surface mount device. A plurality of standoff members are disposed in the underfill material to provide a separation distance between the circuit board and the surface mount device.

According to a further aspect of the present invention, a method of forming an electronic package having a controlled height standoff distance between a surface mount device and a circuit board is provided. The method includes the steps of providing a circuit board having a substrate and circuitry including at least one mounting pad, and providing a surface mount device having circuitry including at least one contact terminal. The method also includes the steps of disposing an underfill material between the circuit board and the surface mount device and disposing a plurality of standoff members in the underfill material. The method further includes the step of forming a solder joint to connect at least one contact terminal of the surface mount device to at least one of the mounting pad on the circuit board, wherein the standoff members provide a separation distance between the circuit board and the surface mount device.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
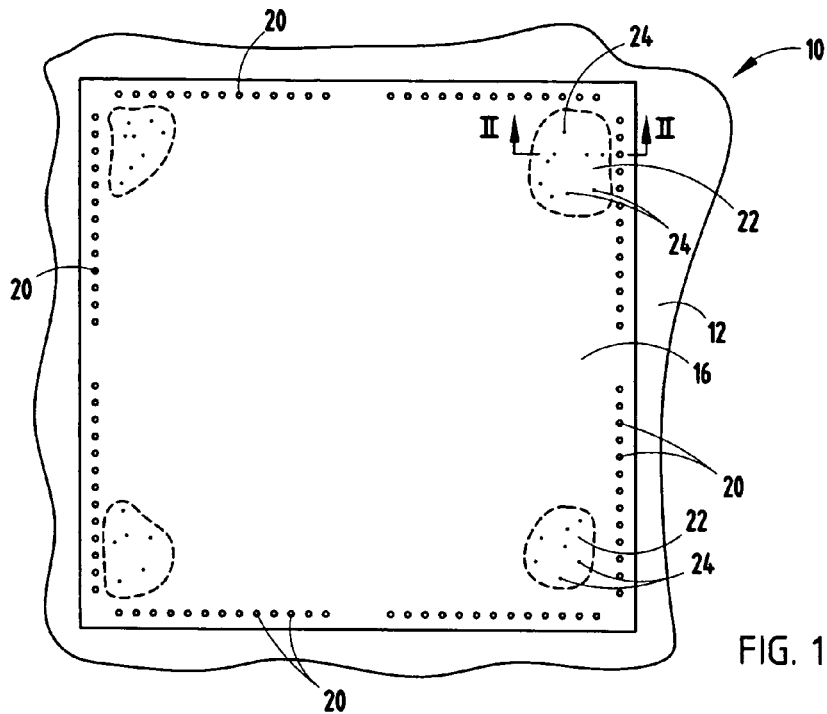
FIG. 1 is top view of a portion of an electronic package having a surface mount device connected via solder joints to a circuit board.
Figure 2:
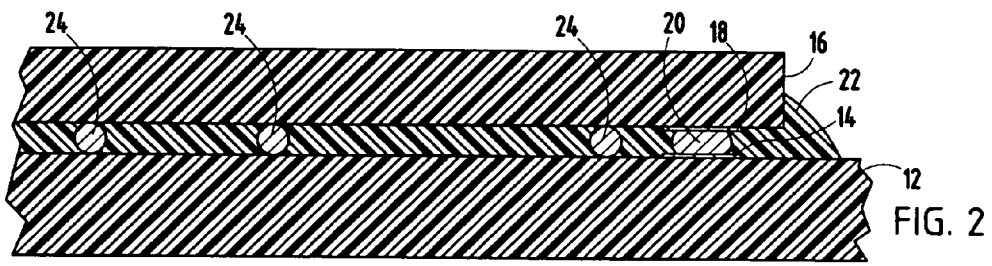
FIG. 2 is an enlarged cross-sectional view taken through lines II—II of FIG. 1 illustrating standoff members disposed in an underfill material according to a first embodiment of the present invention.

Referring to FIGS. 1 and 2, a portion of an electronic package 10 is generally illustrated having a surface mount electronic device 16 mounted onto the surface of a circuit board 12. The surface mount electronic device 16 is connected to the circuit board 12 by way of controlled height solder joint interconnections achieved according to the present invention. While only a portion of the electronic package 10 is shown and described herein, it should be appreciated that the electronic package 10 may include any of a number of one or more surface mount electronic devices 16 connected onto circuit board 12.

The circuit board 12 may include a printed circuit board having a dielectric substrate and electrically conductive circuitry, such as printed circuit traces as should be evident to those skilled in the art. The circuit board 12 may include electrical circuitry fabricated on the upper and lower surfaces, as well as electrical circuitry located in intermediate layers of the dielectric substrate. The dielectric substrate of the printed circuit board 12 may include an organic-based material, such as organic resin reinforced by fibers, according to one example. Alternately, the circuit board 12 may include inorganic material as the dielectric substrate. Examples of circuit board materials include FR4, alumina, metal plated plastic, flex on aluminium, porcelainized steel and other suitable circuit board materials.

Formed on the upper surface of circuit board 12 is electrically conductive circuitry including electrically conductive mounting pads 14 which serve to mechanically and electrically connect the surface mount device 16 to circuit board 12. The mounting pads 14 define a portion of the electrical circuitry that is connected to a solder ball joint. A solder resist layer (not shown) may be printed on the upper surface of each of the mounting pads 14 to define a solder window boundary that contains the volume of reflowed solder. During a solder reflow process, a reflowed solder ball is reshaped on the upper surface of a corresponding mounting pad 14.

The surface mount electronic device 16 is mechanically connected and electrically coupled to the printed circuit board 12. The surface mount electronic device 16 is shown in the exemplary embodiment having a plurality of solder ball joints 20 generally attached on the bottom surface near the perimeter of surface mount device 16. The solder balls 20 may be preformed spherical balls attached onto contact terminals 18 of the surface mount electronic device 16. The solder balls 20 may be attached to contact terminals 18 as a solder paste prior to connection on the circuit board 12. During assembly, each solder ball 20 is aligned and is brought into contact with a contact pad 14 on the top surface of printed circuit board 12. In the exemplary embodiment shown, the surface mount electronic device 16 is a chip, such as a flip chip, having an array of solder balls 20 mechanically and electrically coupled to contact terminals 18 on the bottom side of the surface mount device 16.

The surface mount electronic device 16 may include any of a number of surface mount electronic devices including semiconductor chips, such as flip chips, ball grid arrays, and other electronic devices. Other examples of the surface mount electronic device 16 may include an electronic component such as a diode, an inductor, a capacitor, a resistor, a varistor, as well as other electrical connecting devices that are mechanically mountable onto the surface of the circuit board 12.

The surface mount electronic device 16 shown is a lead-less chip device having contact terminals 18 for providing mechanical support connections and electrical signal connections to electrical circuitry on the surface mount device 16. The contact terminals 18 may each include a separate layer of electronically conductive material or may include a conductive surface of the electronic component. Each of the contact terminals 18 are mechanically and electrically coupled to the circuit board 12 by way of solder joints 20. The solder joints 20 are electrically conductive and serve to form both a mechanical interconnection and an electrical circuit path between the surface mount electronic device 16 and circuit board 12.

Additionally, the electronic package 10 includes an underfill material 22 disposed between the surface mount electronic device 16 and printed circuit board 12. The underfill material 22 serves to stabilize the surface mount device 16 by at least partially fill the space between the surface mount electronic device 16 and the circuit board 12. The underfill material 22 may further serve to adhere the surface mount electronic device 16 to circuit board 12 and/or serve as a solder flux to enhance the wetting of the solder.

In the embodiment shown in FIG. 1, the underfill material 22 is disposed at four discrete locations, generally in regions near the four corners of the printed circuit board 12. The underfill material 22 may include a no-flow underfill such as Dexter Fluxfill 2200, according to one example. According to another exemplary embodiment, the underfill material 22 may include an adhesive such as Chipbonder 3621, according to one example. According to a further exemplary embodiment, the underfill material 22 may include a solder flux such as no-clean, RMA flux, according to one example. While the underfill 22 is shown partially consuming the volume between a surface mount electronic device 16 and a circuit board 12, it should be appreciated that the underfill material 22 may completely fill the entire gap between the surface mount electronic device 16 and the circuit board 12.

The electronic package 10 of the present invention employs a plurality of standoff members 24 disposed within the underfill material 22 to provide a controlled height connection of the solder joints 20. The standoff members 24 may include spherical standoff balls that are premixed into the underfill material 22. The underfill material 22 further serves to contain the standoff members 24 in a general location between the surface mount device 16 and the circuit board 12.

The standoff balls 24 in one embodiment are spherical to allow the standoff balls 24 to move within underfill material 22 when engaged in interference contact with solder balls 20. However, the solder balls 20 may be configured in other shapes. The size of the standoff balls 24 is less than the size of the solder bumps 20 prior to reflow to allow the solder balls to wet, but is large enough to prevent collapse of the solder balls 20. According to one embodiment, the standoff members 24 each have a height dimension less than a height dimension of the solder bumps 20 prior to reflow and, more particularly, within a range of fifty to ninety percent (50 to 90%) of the height of the solder balls 20 prior to reflow.

The standoff members 24 may be made from flexible polymers, silica, cured underfill epoxies and other similar materials. The use of a polymer as the standoff members 24 may minimize stress on the surface mount device 16. Alternately, the use of a silica as the standoff members 24 may allow for a lower cost. The use of an epoxy as the standoff members 24 may provide for good adhesion to the underfill material 22 and good match of coefficients of thermal expansion. The standoff members 24 can be mixed in the underfill material 22 prior to disposing the underfill material 22, or may be applied to the underfill material 22 after the underfill material 22 is applied to one of the surface mount electronic device 16 and circuit board 12.

The number of standoff members 24 disposed in the underfill material 22 may be sufficiently small, but preferably should not adversely affect the viscosity of the underfill material 22. Since the standoff members 24 are spherical and are not much smaller than the initial height dimension of the solder balls 20, the standoff members 24 are easily pushed out from under the solder balls 20 during placement of the surface mount device 16 onto circuit board 12. By employing standoff members 24 in the underfill material 22, a controlled solder joint height may be achieved to elevate the surface mount electronic device 16 from the circuit board 12 to eliminate the need for a solder mask and achieve the increase component standoff height.

Figure 3:
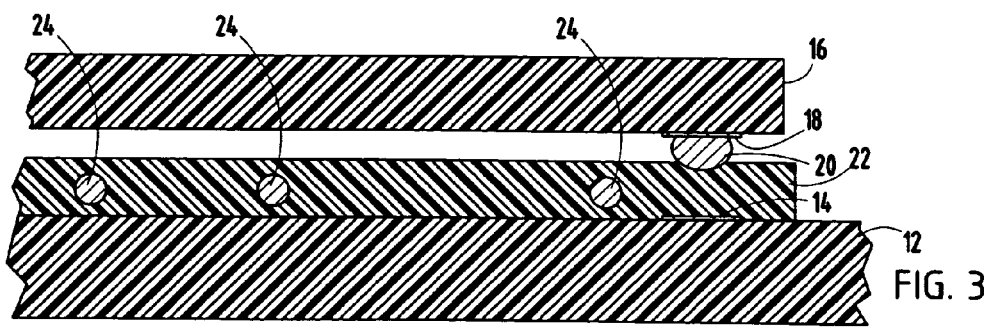
FIG. 3 is a cross-sectional view illustrating assembly of the electronic package shown in FIG. 2.
Figure 4:
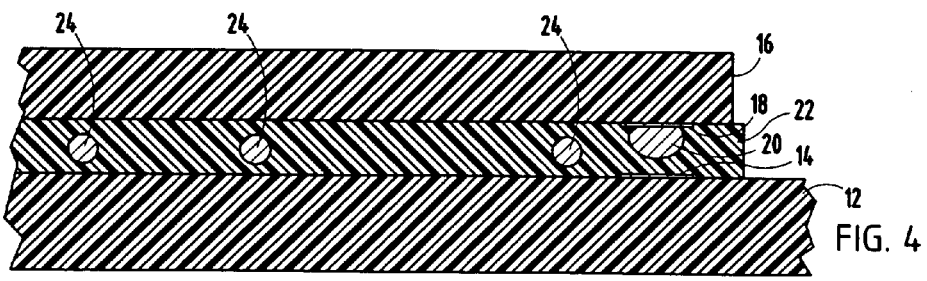
FIG. 4 is a cross-sectional view further illustrating assembly of the electronic package shown in FIG. 2.

During assembly, as seen in FIGS. 3 and 4, the surface mount device 16 is brought into contact with the circuit board 12, such that the solder balls 20 pass through the underfill material 22 into contact with contact pads 14. In doing so, the solder balls 20 push the interfering underfill material 22 and any interfering standoff members 24 away to allow solder balls 20 to contact pads 14. The solder balls 20, prior to reflow, have a substantially spherical shape, according to one embodiment. Once in position on top of the contact pad 14 of circuit board 12, the solder joints 20 are formed. The solder joints 20 may be formed by applying an elevated temperature (heat) to the electronic package 10 to cause the solder bumps 20 to reflow on contact pads 14. During the reflow process, the standoff members 24 serve to maintain a separation distance between the surface mount device 16 and circuit board 12. The heated solder balls 20 are reflowed and change shape and are subsequently cooled to solidify and form an electrical and mechanical connection between the contact terminal 18 and mounting pad 14.

It should be appreciated that the resulting solder joints 20 achieve a controlled height elevated standoff separation distance between the surface mount device 16 and printed circuit board 12. The controlled standoff height results in a narrow width solder joint 20, which advantageously provides for enhanced vibration and thermal expansion properties, while preventing short circuiting with adjacent solder joints 20.

The solder joint 20 may be formed of any of a number of known solder materials. According to one exemplary embodiment, the solder joint 20 may be comprised of a tin-lead eutectic solder or a tin-lead-copper solder having a reflow temperature of about two hundred twenty degrees Celsius (220° C.). It should be appreciated that the standoff members 24 have a higher elevated melting temperature, such that the standoff members 24 do not change shape during the reflow or curing of the solder joints 20.

Figure 5:
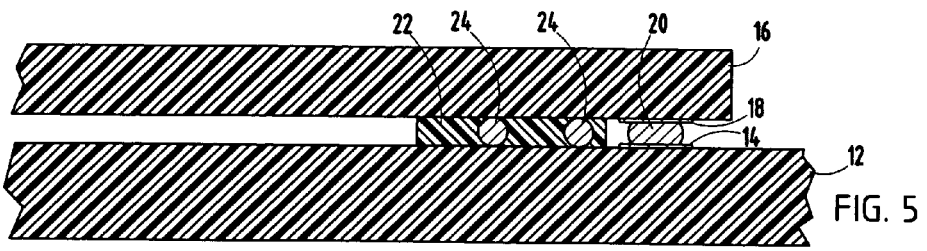
FIG. 5 is a cross-sectional view of an electronic package employing standoff members disposed in a more limited underfill material according to a second embodiment of the present invention.

Referring to FIG. 5, the electronic package 10 is illustrated according to a second embodiment having a reduced volume underfill material 22 which does not encompass or otherwise surround the solder joint 20. The standoff members 24 are all disposed within the underfill material 22 and the underfill material 22 is separated from the solder joint 20. In this embodiment, the underfill material 22 may include an adhesive, but does not require solder flux properties due to the lack of any solder joint 20 present within the underfill material 22.

Figure 6:
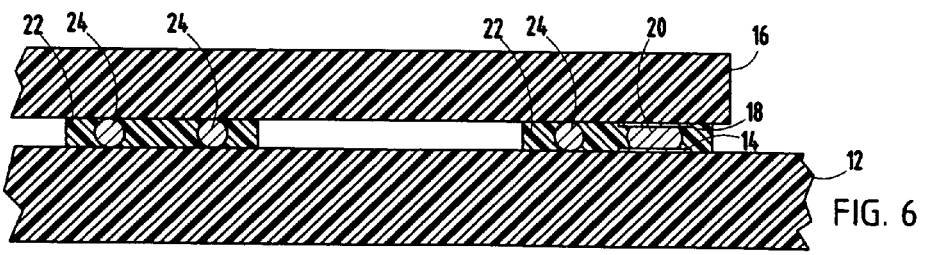
FIG. 6 is a cross-sectional view of an electronic package illustrating standoff members disposed in an underfill material according to a third embodiment of the present invention.

Referring to FIG. 6, an electronic package 10 is shown according to a third embodiment in which the underfill material 22 is provided in two discrete reduced volumes, one of which encompasses the solder joint 20 and the standoff members 24 together. When the underfill material 22 surrounds or otherwise contacts the solder joint 20, it may be advantageous to employ a solder flux underfill material. It should be appreciated that any of a number of sizes and shapes of underfill material 22 may be employed that either partially or completely fill the region between the surface mount device 16 and circuit board 12.

Accordingly, the use of standoff members 24 in an underfill material 22 between a surface mount electronic device 16 and a circuit board 12 advantageously provides for a controlled standoff height while allowing for complete and simplified capillary underfill and overmold. The enhanced standoff height advantageously increases solder joint thermal cycle reliability by reducing solder strain caused by differences in coefficients of thermal expansion. Additionally, the cost of providing the standoff members 24 is very low and eliminates pattern alignment issues associated with the use of solder mask or solder stops.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. A method of forming an electronic package having a controlled height standoff distance between a surface mount device and a circuit board, said method comprising the steps of:
   providing a circuit board having a substrate and circuitry comprising at least one mounting pad;
   providing a surface mount device having circuitry comprising at least one contact terminal;
   disposing an underfill material at a plurality of discrete locations between the circuit board and the surface mount device;
   disposing a plurality of standoff members in the underfill material at the plurality of discrete locations; and
   forming a solder joint to connect the at least one contact terminal of the surface mount device to the at least one of the mounting pad on the circuit board, wherein the standoff members provide a separation distance between the circuit board and the surface mount device;
   wherein the step of forming the solder joint comprises providing at least one solder ball in contact with the at least one contact pad and the at least one contact terminal, and heating the at least solder ball to reflow and form the solder joint; wherein the solder ball has a height dimension and wherein each of the standoff members has a height dimension less than the height dimension of the solder ball.

2. The method as defined in claim 1, wherein the solder ball is substantially spherical and has a height dimension and wherein each of the standoff members has a height dimension less than the height dimension of the solder ball.

3. The method as defined in claim 2, wherein each of the standoff members has a height dimension in the range of fifty to ninety percent of the height dimension of the solder ball.

4. The method as defined in claim 1, wherein the step of disposing an underfill material comprises disposing a dielectric material between at least a portion of the circuit board and the surface mount device.

5. The method as defined in claim 1, wherein the step of disposing an underfill material comprises disposing a no-flow underfill material between the circuit board and the surface mount device.

6. The method as defined in claim 1, wherein the step of disposing an underfill material comprises disposing an adhesive between the circuit board and the surface mount device.

7. The method as defined in claim 1, wherein the step of disposing an underfill material comprises disposing a solder flux between the circuit board and the surface mount device.

8. The method as defined in claim 1, wherein the step of forming a solder joint comprises forming a plurality of solder joints to contact a plurality of terminals of the surface mount device and a plurality of contact pads on the circuit board.

9. The method as defined in claim 1 further comprising the step of further disposing an underfill material between the circuit board and the surface mount device to completely fill the volume therebetween.

10. A method of forming an electronic package having a controlled height standoff distance between a surface mount device and a circuit board, said method comprising the steps of:

providing a circuit board having a substrate and circuitry comprising at least one mounting pad;

providing a surface mount device having circuitry comprising at least one contact terminal;

disposing an underfill material at a plurality of discrete locations between the circuit board and the surface mount device, wherein the underfill material comprises an adhesive;

disposing a plurality of substantially spherical standoff members in the underfill material at the plurality of discrete locations;

providing at least one solder ball in contact with the at least one contact pad and the at least one contact terminal, wherein the solder ball has a height dimension and wherein each of the standoff members has a height dimension in the range of fifty to ninety percent of the height dimension of the solder ball; and forming a solder joint to connect the at least one contact terminal of the surface mount device to the at least one of the mounting device on the circuit board by heating the at least one solder ball to reflow and form the solder joint, wherein the standoff members provide a separation distance between the circuit board and the surface mount device.

11. The method as defined in claim 10, wherein the step of disposing an underfill material comprises disposing a no-flow underfill material.

12. The method as defined in claim 10 further comprising the step of further disposing an underfill material between the circuit board and the surface mount device to completely fill the volume therebetween.

13. The method as defined in claim 10, wherein the step of disposing an underfill material comprises disposing an underfill material comprising the adhesive and a solder flux.

14. A method of forming an electronic package having a controlled height standoff distance between a surface mount device and a circuit board, said method comprising the steps of:

providing a circuit board having a substrate and circuitry comprising at least one mounting pad;

providing a surface mount device having circuitry comprising at least one contact terminal;

disposing an underfill material at a plurality of discrete locations between the circuit board and the surface mount device, wherein the underfill material comprises a solder flux;

disposing a plurality of substantially spherical standoff members in the underfill material at the plurality of discrete locations;

providing at least one solder ball disposed in the underfill material and in contact with the at least one contact pad and the at least one contact terminal, wherein the solder ball has a height dimension and wherein each of the standoff members has a height dimension in the range of fifty to ninety percent of the height dimension of the solder ball; and forming a solder joint to connect the at least one contact terminal of the surface mount device to the at least one of the mounting device on the circuit board by heating the at least one solder ball to reflow and form the solder joint, wherein the standoff members provide a separation distance between the circuit board and the surface mount device.

15. The method as defined in claim 14, wherein the step of disposing an underfill material comprises disposing a no-flow underfill material.

16. The method as defined in claim 14 further comprising a step of further disposing an underfill material between the circuit board and the surface mount device to completely fill the volume therebetween.

17. The method as defined in claim 14, wherein a step of disposing an underfill material comprises disposing an underfill material comprising an adhesive and the solder flux.

* * * * *